(12) United States Patent
Tuttle

(10) Patent No.: US 6,785,159 B2
(45) Date of Patent: Aug. 31, 2004

(54) COMBINATION ETCH STOP AND IN SITU RESISTOR IN A MAGNETORESISTIVE MEMORY AND METHODS FOR FABRICATING SAME

(75) Inventor: Mark E. Tuttle, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/231,803

(22) Filed: Aug. 29, 2002

(65) Prior Publication Data

US 2004/0042261 A1 Mar. 4, 2004

(51) Int. Cl.$^7$ ............................................... G11C 11/00
(52) U.S. Cl. ....................................... 365/158; 365/171
(58) Field of Search .................................. 365/158, 171

(56) References Cited

U.S. PATENT DOCUMENTS 5,940,319 A * 8/1999 Durlam et al. .............. 365/171
6,487,110 B2 * 11/2002 Nishimura et al. .......... 365/158
2003/0179601 A1 * 9/2003 Seyyedy et al. ............ 365/158

* cited by examiner

Primary Examiner—Michael S. Lebentritt
Assistant Examiner—Pho M. Luu
(74) Attorney, Agent, or Firm—Knobbe Martens Olson & Bear, LLP

(57) ABSTRACT

Magnetic memory elements and methods for forming the same, where a magnetic memory element includes an etch stop layer disposed between a lower electrode and a magnetoresistive cell body or stack. The etch stop layer advantageously protects the lower electrode during patterning of the magnetoresistive cell body. The etch stop layer can be patterned with patterning of the magnetoresistive cell body. The etch stop layer can be formed from conductive materials or from resistive materials. When the etch stop layer is formed from resistive materials, the etch stop layer forms an in situ resistor that can isolate a failed memory cell from other memory cells in a corresponding array of cells, such as in an MRAM. This permits the MRAM to continue to utilize other magnetoresistive cells that are coupled to the electrodes in the event of a failure of the magnetoresistive cell.

53 Claims, 15 Drawing Sheets

US 6,785,159 B2

COMBINATION ETCH STOP AND IN SITU RESISTOR IN A MAGNETORESISTIVE MEMORY AND METHODS FOR FABRICATING SAME

RELATED APPLICATION

This application is related to copending application entitled MAGNETORESISTIVE MEMORY AND METHOD OF MANUFACTURING THE SAME, Ser. No. 10/214,805, filed on Aug. 7, 2002, the entirety of which is hereby incorporated by reference.

BACKGROUND OF THE INVENTION

1. Field of the Invention

The invention generally relates to magnetic memory elements and methods for forming the same. In particular, the invention relates to structures and methods for forming a magnetoresistive stack for a magnetoresistive memory element of a magnetic random access memory (MRAM).

2. Description of the Related Art

An example of a magnetoresistive memory element, (hereinafter "magnetic memory cell") for a magnetic random access memory (MRAM) includes, in general, two ferromagnetic layers separated by a non-magnetic layer. One of the ferromagnetic layers has a relatively high coercivity and is provided a fixed or "pinned" magnetic vector. The other ferromagnetic layer has a lower coercivity, wherein the orientation of its magnetic vector can be "varied" by a field not large enough to re-orient the pinned layer.

In a tunneling magnetoresistance (TMR) device, the layer of non-magnetic material corresponds to a relatively thin layer of insulating material, which is made thin enough to permit electron tunneling, i.e., quantum mechanical tunneling of electrons from one of the ferromagnetic layers to the other. The passage of electrons through the stack of layered materials depends upon the orientation of the magnetic vector of the soft magnetic or variable layer relative to that of the pinned layer; electrons pass more freely when the magnetic vectors of the variable and pinned layers are aligned.

In an exemplary, known method of manufacturing a magnetoresistive memory cell, multiple layers of magnetic and non-magnetic materials are deposited and patterned over an electrically conductive wire, wherein a region of the electrically conductive wire serves as an electrode for the magnetic memory cell. In one arrangement, the layers of the magnetic cell are deposited as blanket layers over parallel wires and then etched into separate stacks. Each wire extends under several such stacks. Upper electrodes are formed by creating parallel conductive wires generally running perpendicular to the lower wires. Where the magnetic stacks extend between the lower conductive wires and the upper conductive wires at their intersections, the array is known as a "cross-point" cell configuration.

The cross-point cell configuration advantageously permits a relatively large number of memory cells to be accessed with relatively few electrodes. Disadvantageously, however, if a memory cell in a cross-point array fails in a shorted state, the corresponding electrodes in the array are shorted together, which in turn can limit the usefulness of all the memory cells that are coupled to the affected electrodes, thereby wasting valuable memory space. Accordingly, there is a need to prevent a failed memory cell from interfering with the use of working memory cells that are coupled to the same electrode (row or column) as the failed memory cell.

Copper can be used to form the electrodes of the cross-point cell configuration. Copper is advantageous as a material for an electrode because of the relatively high conductivity of copper. However, chlorine-based etchants, which may be used to remove magnetic material from selected regions of a substrate assembly to define magnetic cells, can also adversely affect a copper electrode. In addition, as cell geometries shrink, relative alignment of photoresist masks and the like becomes more difficult. Misalignment of a mask with a lower conductor can result in unintentional exposure of the lower conductor to the etchants intended to pattern the cells. Accordingly, there is a need to protect the copper of an electrode from chemistries of processes that may be used during patterning of the magnetic material associated with the fabrication of a magnetic memory cell.

In a damascene process, lower lines, grooves, or trenches are formed within a layer of insulating material in the desired pattern of the lower wires. A conductive material is then laid into the trenches to form the electrodes. Disadvantageously, copper diffuses relatively quickly through typical oxide-based insulators. Accordingly, a barrier layer, e.g., a layer of tantalum, is formed as a liner conformably over the bottom and sidewalls of the trench. The barrier layer can also include multi-layered structures, such as two layers of tantalum sandwiching a layer of nickel-iron, to additionally perform a magnetic "keeper" function. The trench is then filled with a conductive material, such as copper, to form the electrode.

In one conventional damascene process for forming electrodes, copper fills a trench lined with barrier material, as described above. The trench can be referred to as a damascene trench. A planarization process provides an etchback of the copper until material from the insulating layer is exposed. However, the materials that form the liner and the electrode can be etched away by the planarization process at varying rates, which can result in a relatively uneven topography. For example, a portion of the barrier layer can protrude above the exposed surface of the planarized copper and above the exposed surface of the insulating layer. Conversely, depending upon etch chemistry and materials, the barrier layer can be recessed relative to the upper surface of the structure.

This uneven topography undesirably decreases the producibility of the MRAM. When a layer of ferromagnetic material is deposited over such an uneven surface, e.g., with the protruding ears, the uneven surface may degrade or alter properties of the magnetic layer. Therefore, when forming layers of magnetic material over a surface to fabricate a magnetic memory, it is desirable that the surface includes a relatively smooth, flat or planar topography in order to preserve the integrity of the magnetic material.

Accordingly, there is a need to provide a structure for, and process of fabricating, an electrode structure exhibiting a flat topography for a magnetic memory cell.

SUMMARY OF THE INVENTION

In accordance with one aspect of the invention, a magnetic memory element includes an etch stop layer disposed between a lower electrode and a magnetoresistive cell body or stack. The etch stop layer advantageously protects the lower electrode during patterning of the magnetoresistive cell body. The etch stop layer can be patterned with patterning of the magnetoresistive cell body, can be patterned by itself, or combinations of both. The etch stop layer can be formed in the same pattern that patterns the magnetoresistive cell bodies. In another embodiment, the etch stop layer is formed in a pattern such that multiple magnetoresistive cell bodies of a common lower electrode are formed on top of a portion of the etch stop layer.

The etch stop layer can be formed from conductive materials or from resistive materials. For example, the etch stop layer can be formed from materials such as tantalum (Ta), aluminum, titanium, tungsten, tantalum nitride (TaN), titanium aluminum nitride (TiAlN), tungsten silicon nitride (WSiN), and tantalum silicon nitride (TaSiN).

When the etch stop layer is formed from resistive materials, the etch stop layer forms an in situ resistor that can isolate a failed memory cell from other memory cells in a corresponding array of cells, such as in an MRAM. This permits the MRAM to continue to utilize other magnetoresistive cells that are coupled to the electrodes in the event of a failure of the magnetoresistive cell. One embodiment of the invention corresponds to an in situ resistor that is formed by portions of the etch stop layer.

BRIEF DESCRIPTION OF THE DRAWINGS

These and other features of the invention will now be described with reference to the drawings summarized below. These drawings (not to scale) and the associated description are provided to illustrate preferred embodiments of the invention and are not intended to limit the scope of the invention.

DETAILED DESCRIPTION OF PREFERRED EMBODIMENTS

Although this invention will be described in terms of certain preferred embodiments, other embodiments that are apparent to those of ordinary skill in the art, including embodiments that do not provide all of the benefits and features set forth herein, are also within the scope of this invention. Accordingly, the scope of the invention is defined only by reference to the appended claims.

Embodiments of the invention advantageously include an etch stop layer between an MRAM stack or cell body and a lower electrode. The etch stop layer protects the lower electrode during patterning of the MRAM cells. This advantageously allows cell geometries to be decreased for higher density memories and/or permits MRAM devices to be made with higher producibility and higher yields, thereby lowering costs. In one embodiment, the etch stop layer is further formed from a resistive material that provides a degree of isolation from a TMR memory cell that fails in a shorted state. The isolation provided by the resistance permits a corresponding memory array to store and retrieve data from other memory cells that are coupled to the same electrodes of a cross-point array.

With reference to FIGS. 1–11, an exemplary embodiment of a method of forming a magneto-resistive memory element of, for example, a magneto-resistive random access memory (MRAM) will be described.

As used herein, the term "substrate," "semiconductor substrate," or "substrate assembly" encompasses structures including semiconductor material, such as, but not limited to, bulk semiconductor materials including a semiconductor wafer (either alone or in combination with an assembly with other materials thereon), and semiconductor material layers (either alone or in assemblies that include other materials). Further, the term "substrate" shall also encompass any supporting structures, including, but not limited to, the semiconductor substrates described above. Furthermore, when reference is made to a substrate within the following description, previous process steps may have been utilized to form regions, structures, or junctions in or on its base semiconductor structure or foundation.

Figure 1:
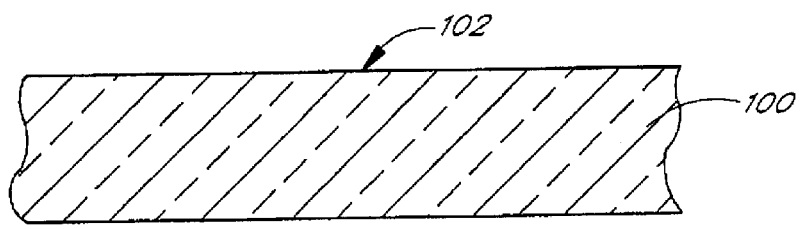
FIG. 1 is a simplified cross-sectional view of a substrate over which a magnetoresistive memory element is to be constructed.

FIG. 1 illustrates a cross-sectional view of a substrate 100. The substrate 100 includes a surface 102 upon which a magnetic memory element is fabricated, as will be shown. The substrate 100 can include, for example, layers and structures (not shown) which are known in the art for the formation of electrical circuitry.

Figure 2:
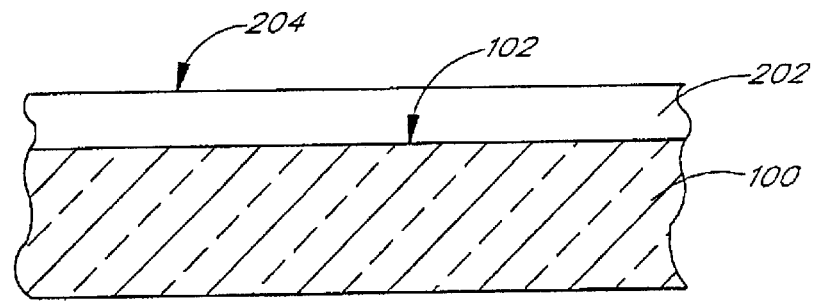
FIG. 2 is a partial cross-sectional view schematically illustrating an intermediate step in the formation of a magnetoresistive memory element, where a layer of insulating material is deposited over the substrate.

With reference to FIG. 2, a layer of an insulating material 202 is formed on the surface 102 of the substrate 100. As illustrated in FIG. 2, the surface 102 of the substrate 100 is relatively flat. However, it will be understood that certain advantages of the preferred embodiments can be achieved using substrates with non-flat surfaces and substrates with additional structures over which the insulating material 202 may be deposited.

In one embodiment of the invention, the layer of the insulating material 202 is formed with a thickness within a range of about 500 angstroms (Å) to about 10,000 Å. A broad variety of techniques can be used to form the layer of the insulating material 202. For example, deposition techniques such as chemical vapor deposition (CVD), low pressure CVD (LPCVD), plasma enhanced CVD, and the like. In one embodiment, the insulating material 202 is formed by spin coating of borophosphosilicate glass (BPSG). Alternatively, the formation of insulating material may include, for example, CVD oxide ($SiO_2$) or silicon nitride (SiN), low or high pressure tetraethylorthosilicate (TEOS) procedures, fluorine or carbon-doped low-k materials, or other doped or undoped glass deposition methods. In other embodiments, the insulating material 202 can be formed from high temperature tolerant polymers, such as a polyimide.

After depositing the layer of the insulating material 202, the layer is planarized to provide a relatively flat and planar upper surface 204. The upper surface 204 can be planarized by a variety of planarization procedures, such as, for example, glass reflow, plasma or chemical mechanical planarization (CMP).

Figure 3:
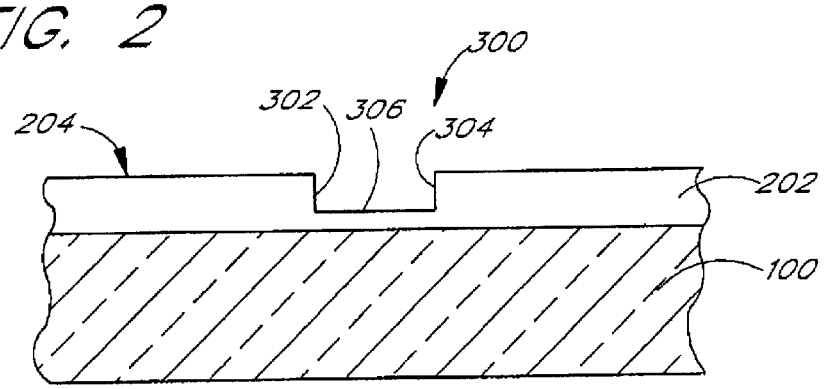
FIG. 3 is a partial cross-sectional view schematically illustrating an intermediate step in the formation of a magnetoresistive memory element, where a groove or trench is formed within the layer of insulating material.

With reference to FIG. 3, a trench 300 is formed within the layer of the insulating material 202. The trench 300 is defined by a first sidewall 302, a second sidewall 304, and a bottom 306. In one embodiment, the trench 300 is formed using photolithography, masking and etching procedures. For example, a layer of photoresist can be applied over the layer of the insulating material 202. The layer of photoresist can be patterned to define openings that expose selected portions of the layer of the insulating material 202. A wet etching process or a dry etching process removes regions of the layer of the insulating material 202 that are exposed through the openings of the layer of photoresist. In one embodiment, the trench 300 is formed with a depth in the range of about 500 Å to about 5,000 Å, and more preferably a depth of about 2,000 Å. Preferably, the depth of the trench 300 is less than the thickness of the layer of the insulating material 202.

Figure 4:
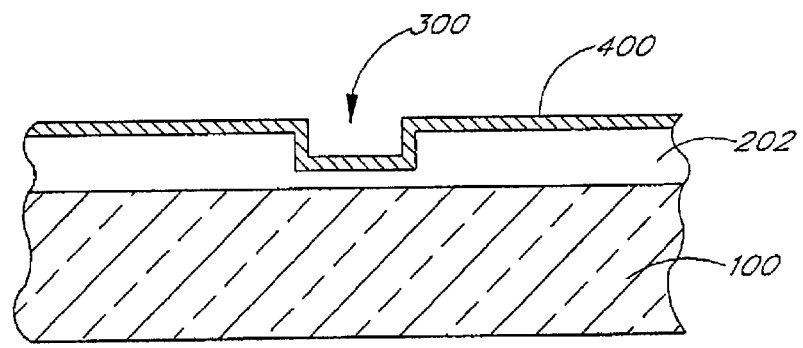
FIG. 4 is a partial cross-sectional view schematically illustrating an intermediate step in the formation of a magnetoresistive memory element, where a liner is formed conformably over the insulating material and within the trench.

As illustrated in FIG. 4, a liner 400 is conformably formed over the layer of the insulating material 202 and within the trench 300. In accordance with one embodiment of the invention, the liner 400 includes a conductive barrier material, e.g., tantalum (Ta), titanium (Ti), tungsten (W), titanium tungsten (TiW), titanium nitride (TiN) or chromium (Cr), and is selected to provide relatively strong mechanical bonding between the electrically conductive wire of the electrode to be formed and the insulating material 202. Additionally, the composition of the liner 400 is selected to prevent migration of elements to and from the electrically conductive wire and the insulating material 202. In one embodiment, the liner 400 is formed by sputtering of tantalum (Ta) and is deposited with a thickness within a range of about 50 Å to about 100 Å.

Figure 5:
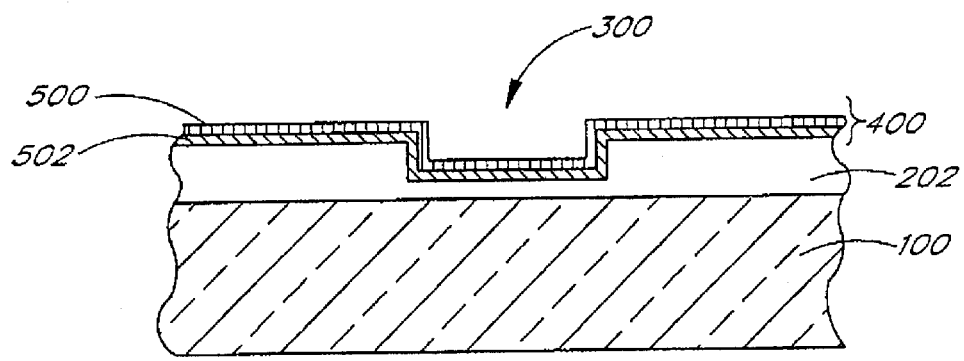
FIG. 5 is a partial cross-sectional view schematically illustrating an intermediate step in the formation of a magnetoresistive memory element, where a barrier layer is formed over the insulating layer and within the trench.
Figure 6:
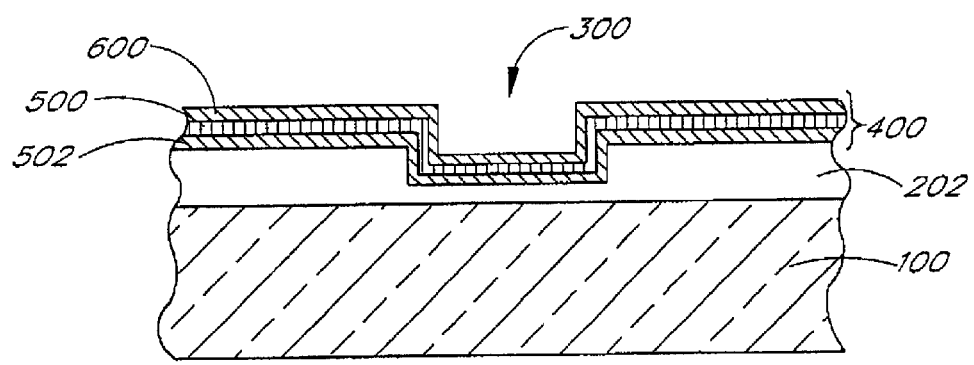
FIG. 6 is a partial cross-sectional view schematically illustrating an intermediate step in the formation of a magnetoresistive memory element, where the liner includes a sandwich of electrically conductive material and ferromagnetic material.

In one embodiment, the liner 400 can correspond to a multi-layer magnetic keeper, as illustrated in FIGS. 5 and 6. As illustrated in FIG. 5, where the liner 400 corresponds to a multi-layer magnetic keeper, a layer of ferromagnetic material 500 is formed over a first barrier layer 502 of electrically conductive material. Additionally, with reference to FIG. 6, another barrier layer 600 of electrically conductive material can also be optionally deposited over the layer of ferromagnetic material 500. In one example, the formation of the liner 400 includes a forming of a layer of tantalum (Ta) for the first barrier layer 502; followed by a forming of a layer of nickel-iron (NiFe) for the layer of ferromagnetic material 500; and thereafter, a forming of another layer of tantalum (Ta) for the other barrier layer 600. This multi-layer structure of tantalum/nickel-iron/tantalum (Ta/NiFe/Ta) for the liner 400 within the trench can serve, at least in part, to provide a magnetic "keeper" function by focusing or confinement of electromagnetic fields about the electrically conductive wire (as may be generated by a current flow through the electrically conductive wire). Accordingly, although the liner 400 may be drawn with a single layer of material, it will be understood that the scope of the invention also encompasses alternative multi-layered liner structures, e.g., as described in connection with FIGS. 5 and 6.

Figure 7:
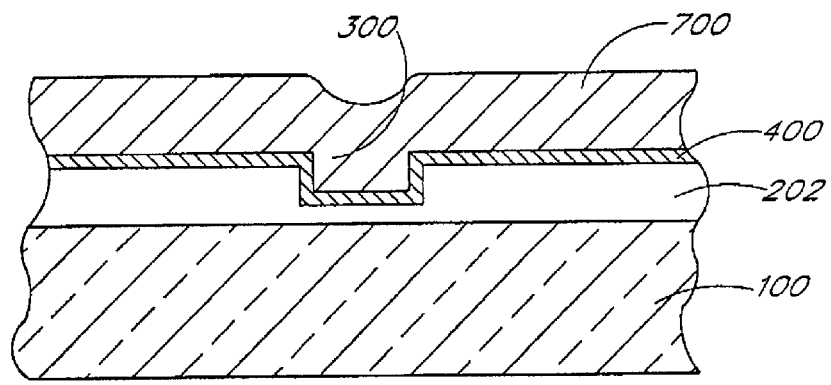
FIG. 7 is a partial cross-sectional view schematically illustrating an intermediate step in the formation of a magnetoresistive memory element, where a conductor is formed within the lined trench of FIG. 4.

Moving forward with further reference to FIG. 7, a conductive material 700 is formed over the liner 400. The conductive material 700 should be formed to at least a thickness sufficient to fill the trench 300. A variety of electrically conductive materials can be used. In one embodiment, the conductive material 700 is copper (Cu), which is preferred for its relatively high conductivity. Other examples for the conductive material 700 include doped polysilicon, aluminum (Al), tungsten (W), gold (Au), various metal alloys, conductive oxides, and the like. A variety of techniques, such as deposition techniques, electroplating techniques, and the like, can be used to form the layer of the conductive material 700.

Figure 8:
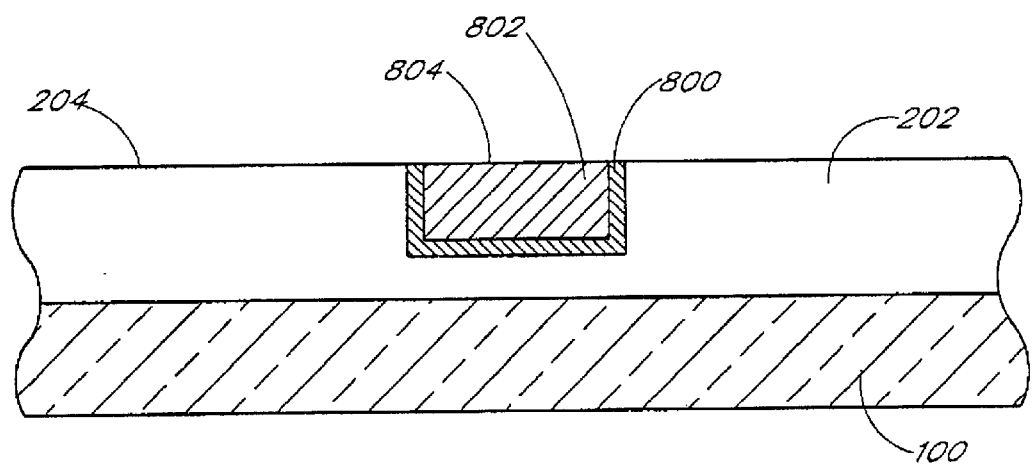
FIG. 8 is a partial cross-sectional view schematically illustrating an intermediate step in the formation of a magnetoresistive memory element, where an upper surface of the substrate assembly is planarized.

With reference to FIG. 8, a planarization procedure is performed to remove portions of the conductive material 700 and the liner 400 from the upper surface 204. The planarization procedure can correspond to chemical mechanical planarization (CMP). It will be understood by one of ordinary skill in the art that the planarization process may also remove a portion of the insulating material 202 so that the upper surface 204 may be at a slightly different level than prior to the performance of the planarization procedure. As a result of the planarization, portions of the conductive material 700 and the liner 400 are left remaining in the trench 300, but not on the upper surface 204. The remaining portions form a lower electrode 802 with a liner 800. Preferably, an upper surface 804 of the lower electrode 802 is approximately coplanar or flush with the upper surface 204 of the insulating material 202. However, it will be understood that the upper surface 804 of the lower electrode 802, an upper surface of the liner 800, or both may be at a different level than the upper surface 204 of the insulating material 202. For example, a CMP process may erode relatively soft metal portions at a relatively faster rate than relatively hard oxide ($SiO_2$) portions.

Figure 9:
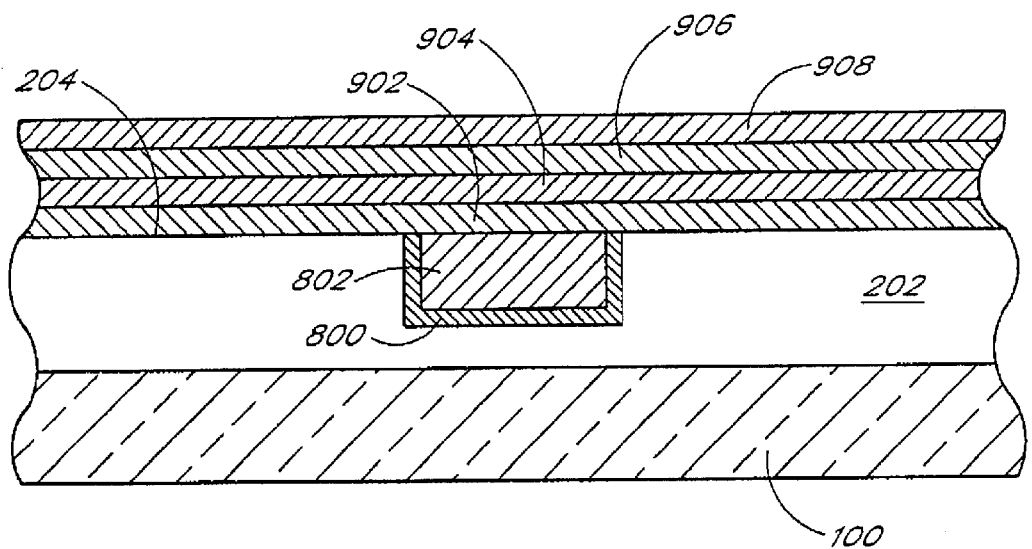
FIG. 9 is a partial cross-sectional view schematically illustrating an intermediate step in the formation of a magnetoresistive memory element, where an etch-stop layer and magnetoresistive layers have been formed.

With respect to FIG. 9, the process forms an etch stop layer 902, a first ferromagnetic layer 904, a spacer layer 906, and a second ferromagnetic layer 908 on the substrate, including the upper surface 204 of the insulating material 202 and the upper surface 804 of the lower electrode 802. The first ferromagnetic layer 904, the spacer layer 906, and the second ferromagnetic layer 908 represent the layers that eventually form the magnetoresistive stack or cell body of the MRAM cell. It will be understood that the specific layers in the magnetoresistive stack can vary broadly and can include other layers. For example, the process can deposit additional layers of ferromagnetic materials and/or spacer layers to form an MRAM cell with a multiple-layer sandwich. The additional layers, e.g., seed layers and pinning layers, can include layers of the same materials and/or can include layers of other materials, such as iridium manganese (IrMn), cobalt iron (CoFe), and the like. It will also be understood that a layer of a barrier material can also be included with the magnetoresistive stack.

As illustrated in FIG. 9, the etch stop layer 902 is formed on the preferably coplanar upper surfaces of the insulating material 202 and the lower electrode 802 such that the etch stop layer 902 is between the layers that form the MRAM cells and the upper surfaces of the insulating material 202 and the lower electrode 802. The etch stop layer 902 advantageously protects the lower electrode 802 from the relatively harsh chemicals that are used to pattern MRAM cells from the first ferromagnetic layer 904, the spacer layer 906, the second ferromagnetic layer 908, and any other layers that may be included with the magnetoresistive stack of the MRAM cell.

The etch stop layer 902 can be formed from materials that are relatively good conductors and from materials that are relatively resistive. However, the etch stop layer 902 should not be formed from a dielectric or insulator. Where a material that is relatively resistive is selected for the etch stop layer 902, the etch stop layer 902 can also form an in situ resistor that can advantageously partially isolate a magnetoresistive cell. The partial isolation prevents a magnetoresistive cell that fails in a shorted state from completely shorting the corresponding electrodes together. This permits an MRAM array to continue to utilize other magnetoresistive cells that are coupled to the electrodes in the event of a failure of the magnetoresistive cell.

The etch stop layer 902 is preferably formed from a material that is not ferromagnetic. A variety of metals and metal alloys can be used to form the etch stop layer 902, where the etch stop layer 902 is relatively conductive. Examples of relatively good conductors, which can be used to form the etch stop layer 902 include tantalum (Ta), aluminum, titanium, and tungsten. A variety of processes can be used to form the etch stop layer 902 from a metal or metal alloy. These processes include physical vapor deposition (PVD), evaporation, sputtering, electroplating, and the like.

The etch stop layer 902 can also be formed from materials that are relatively resistive. In one embodiment, the etch stop layer 902 is formed from at least one of metal nitride, metal nitro-silicide, and metal alloy nitride. Examples of resistive materials from which the etch stop layer 902 can be formed include titanium aluminum nitride (TiAlN), tantalum nitride (TaN), tungsten silicon nitride (WSiN), and tantalum silicon nitride (TaSiN). Advantageously, the resistivity of a metallic nitride can be selected by adjusting the nitrogen content in the metallic nitride. In one embodiment, the resistive materials are selected from materials with relatively high resistivity such that the etch stop layer 902 can be made relatively thin and yet provide an amount of resistance sufficient to protect a memory array from the effects of a failed cell. In one embodiment, the resistivity is at least 0.2 ohm-centimeters ($\Omega$-cm). Preferably, the resistivity is in a range between about 0.2 ($\Omega$-cm) and about 100 $\Omega$-cm. More preferably, the resistivity is in a range between about 0.35 $\Omega$-cm and about 20 $\Omega$-cm.

A variety of techniques, such as PVD and CVD, can be used to form the etch stop layer 902 from resistive materials. The resistive materials can vary with respect to resistivity. Accordingly, the thickness of the etch stop layer 902 can be selected such that the resistance of an in situ resistor created by a portion of the etch stop layer 902 between the lower electrode 802 and the magnetoresistive cell corresponds to a range between about 100 ohms ($\Omega$) and about 1 megohm. It will be understood by one of ordinary skill in the art that the etch stop layer 902 should be relatively thin such that the lower electrode 802 and the magnetoresistive cell remain relatively close. Preferably, the thickness of the etch stop layer 902 corresponds to a range between about 100 Å and about 500 Å thick. In one embodiment, the thickness of the etch stop layer 902 is about 200 Å.

The first ferromagnetic layer 904 and the second ferromagnetic layer 908 can be formed from a variety of ferromagnetic materials, such as nickel iron cobalt (NiFeCo), permalloy (NiFe) and the like. The spacer layer 906 can correspond to an insulator, such as aluminum oxide ($Al_2O_3$), for a TMR cell or to a conductor, such as copper (Cu), for a GMR cell.

FIGS. 10A–E and 11A–E illustrate photoresist structures, which have been formed on the substrate assembly. The photoresist structures are used to pattern the MRAM cells in a corresponding array. In FIGS. 10A–E, the illustrated photoresist structure is relatively well aligned with the lower electrode 802. In FIGS. 11A–E, the illustrated photoresist structure is relatively poorly aligned with the lower electrode 802.

Figure 10A:
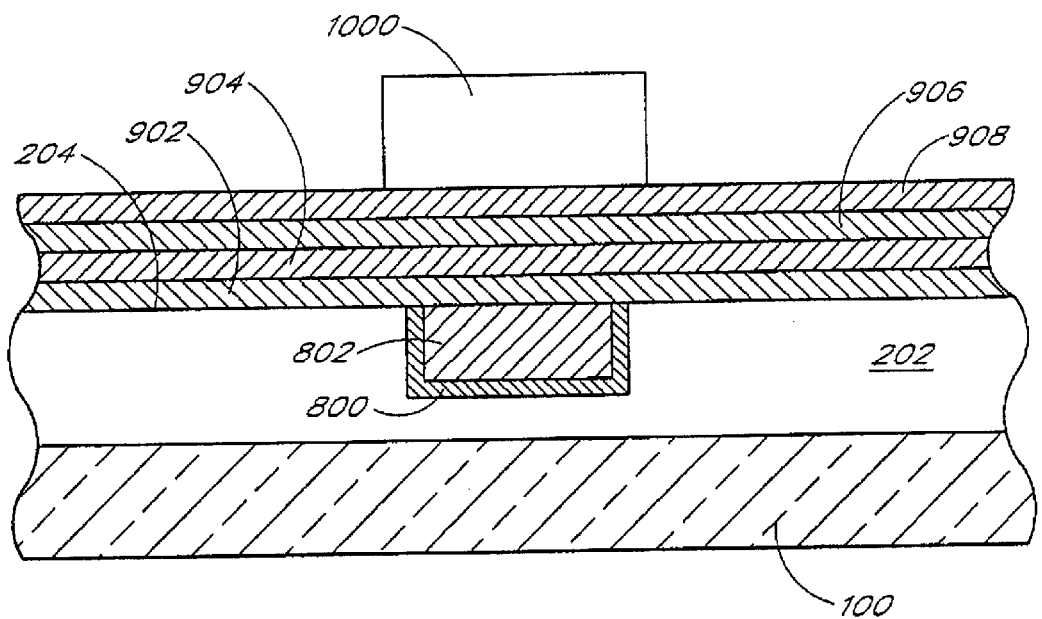
FIGS. 10A–E are partial cross-sectional views that schematically illustrate an intermediate step in the formation of a magnetoresistive memory element, where a resist pattern is relatively well aligned with a lower electrode.

FIG. 10A illustrates a photoresist structure 1000 formed on the second ferromagnetic layer 908. The photoresist structure 1000 can be formed using a photolithography process. In a photolithography process, a layer of photoresist is deposited on the substrate, the layer of photoresist is selectively exposed to light, such as UV light, and unhardened portions of the photoresist are dissolved. Preferably, the photoresist structure 1000 remaining is relatively well aligned with the lower electrode 802 as illustrated in FIG. 10A. In an alternative arrangement, a photoresist patch or structure can be used to pattern a hard mask. The hard mask can be formed from, for example, silicon dioxide ($SiO_2$). The hard mask can then serve to selectively protect regions of the substrate assembly as is described in connection with the photoresist structure 1000 in FIGS. 10A–E.

Figure 10B:
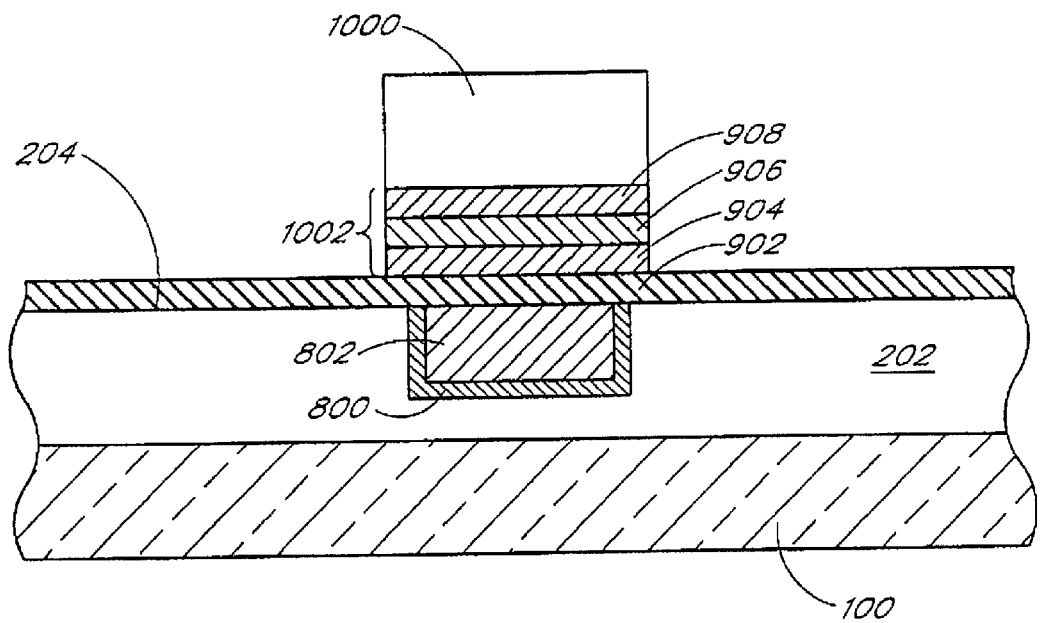

With reference to FIG. 10B, an etching process performed on the substrate assembly to selectively remove portions of the magnetoresistive layers, thereby patterning the MRAM cells. The remaining portions of the first ferromagnetic layer 904, the spacer layer 906, and the second ferromagnetic layer 908 form an MRAM stack 1002. The etching process can correspond to a variety of processes, such as dry etching or wet etching processes. In one embodiment, the etching process is a reactive ion etch (RIE). In another embodiment, the etching process corresponds to ion beam etching (IBE) or ion beam milling. The photoresist structure 1000 protects selected regions of the first ferromagnetic layer 904, the spacer layer 906, and the second ferromagnetic layer 908 from the etchant of the etching process. The etchant is preferably selected according to the materials selected for the etch stop layer 902, the first ferromagnetic layer 904, the spacer layer 906, and the second ferromagnetic layer 908. In one example, the etchant is an ion-plasma etchant of a chlorine-based chemistry.

A variety of techniques can be used to determine when to stop the etching process. For example, optical emission spectroscopy techniques can be used to determine etch endpoint detection.

At least some of the portions of the etch stop layer 902 should be removed from between adjacent lower electrodes so that the remaining portions of the etch stop layer 902 do not undesirably create a short or resistive short between adjacent electrodes. These portions of the etch stop layer 902 should be removed whether the material for the etch stop layer 902 is a relatively good conductor or is relatively resistive. It will be understood by one of ordinary skill in the art that to prevent a short between adjacent conductors, less than all of the portions of the etch stop layer 902 can be removed. For example, portions of the etch stop layer 902 can be removed to leave islands of the etch stop layer 902 underneath corresponding MRAM cells as described later in connection with FIG. 12. In another example, a continuous strip or channel can be removed from the etch stop layer 902 between adjacent electrodes to prevent electrical continuity in the etch stop layer 902 between the adjacent electrodes as described later in connection with FIG. 13.

Figure 12:
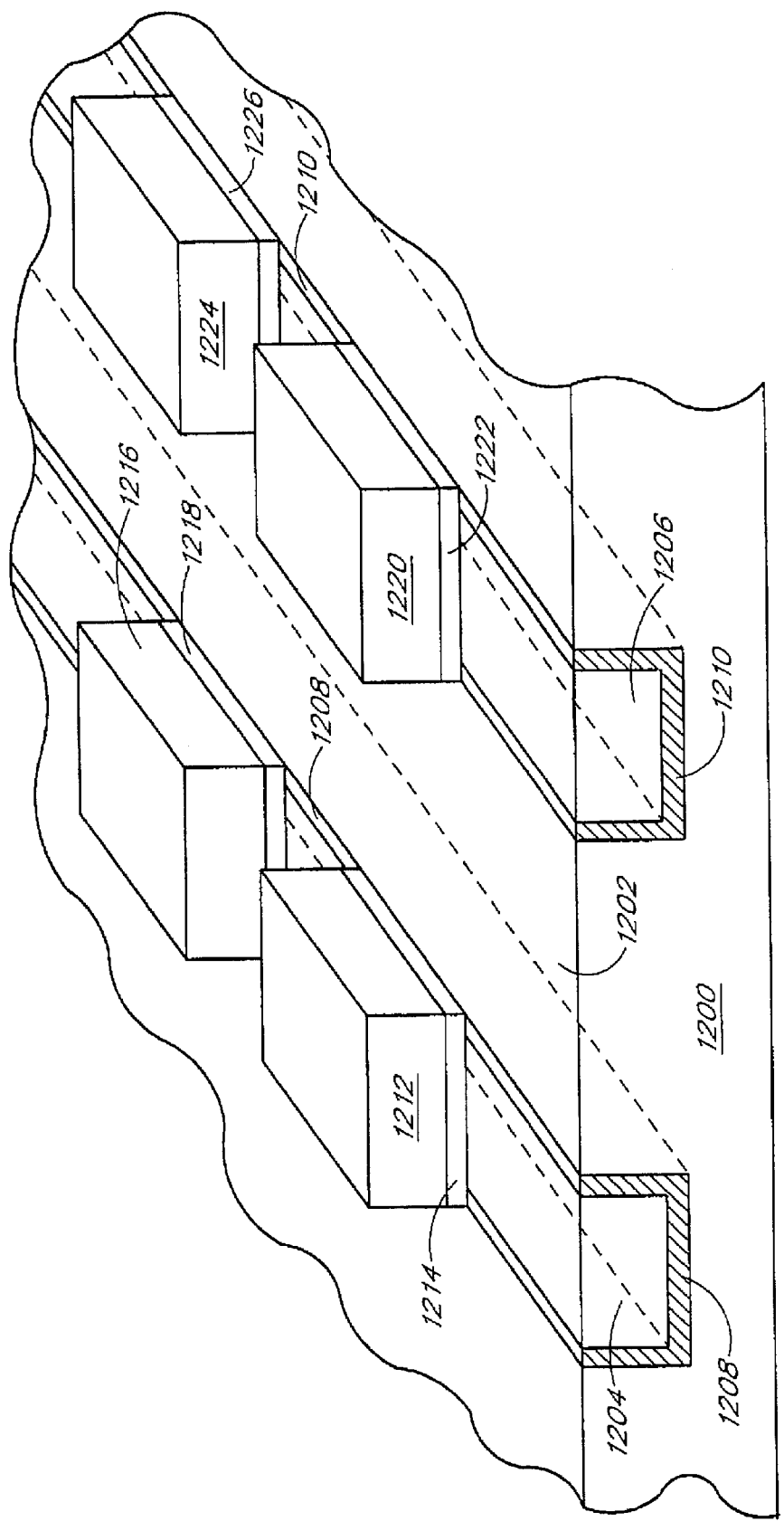
FIG. 12 is a partial perspective view of a portion of a memory array with individual etch stop layers underneath memory elements.

Portions of the etch stop layer 902 can be removed with the same photoresist structure 1000 used to pattern the MRAM stack 1002, as shown in FIG. 12, or can be patterned with a different photoresist structure. For example, while the photoresist structures may define multiple cells on a single lower electrode, the etch stop layer 902 can be provided along the length of the lower electrode as described later in connection with FIG. 13. In addition, where a separate photoresist structure is used to etch the etch stop layer 902, the etching of the etch stop layer 902 can occur before or after the etching of the magnetoresistive cells. An example where the etch stop layer 902 is etched prior to the etching of the magnetoresistive cells is described later in connection with FIGS. 14A–D.

The same etchant or a different etchant can be used to etch the etch stop layer 902 as the etchant used in patterning of the MRAM stack 1002. In one embodiment, a different etchant is used to remove selected portions of the etch stop layer 902. For example, MRAM stack can be patterned with a directional etch or anisotropic etch. Examples of directional etch techniques include reactive ion etching (RIE) and ion beam etching (IBE). The etch stop layer can also be etched with a directional etch or anisotropic etch, and in addition, can also be etched with a selective etch, such as with a chemical etch. The chemical etch can advantageously selectively etch material from the etch stop layer at a more rapid rate than material from the MRAM stack 1002 or the lower electrode 802.

The etchant that removes the selected portions of the etch stop layer 902 is preferably relatively benign to the materials forming the MRAM stack 1002 and the lower electrode 802. A fluorine-based etchant is an example of a suitable etchant for removing portions of the etch stop layer 902 formed from relatively good conductors, such as tantalum (Ta), aluminum, titanium, and tungsten. A fluorine-based etchant can also be used to remove portions of the etch stop layer 902 formed from relatively resistive materials, such as titanium aluminum nitride (TiAlN), tantalum nitride (TaN), tungsten silicon nitride (WSiN), and tantalum silicon nitride (TaSiN). In one embodiment, the material for the etch stop layer 902 is selected from at least one of metal nitride, metal nitro-silicide, and metal alloy nitride.

In one embodiment, the MRAM stack 1002 is first patterned by a directional etch and then the etch stop layer 902 is patterned with a selective etch. In another embodiment, a directional etch first patterns channels down to the insulating layer, thereby patterning the etch stop layer 902, and another directional etch then patterns the MRAM stack 1002 as described later in connection with FIGS. 14A–D.

Figure 10C:
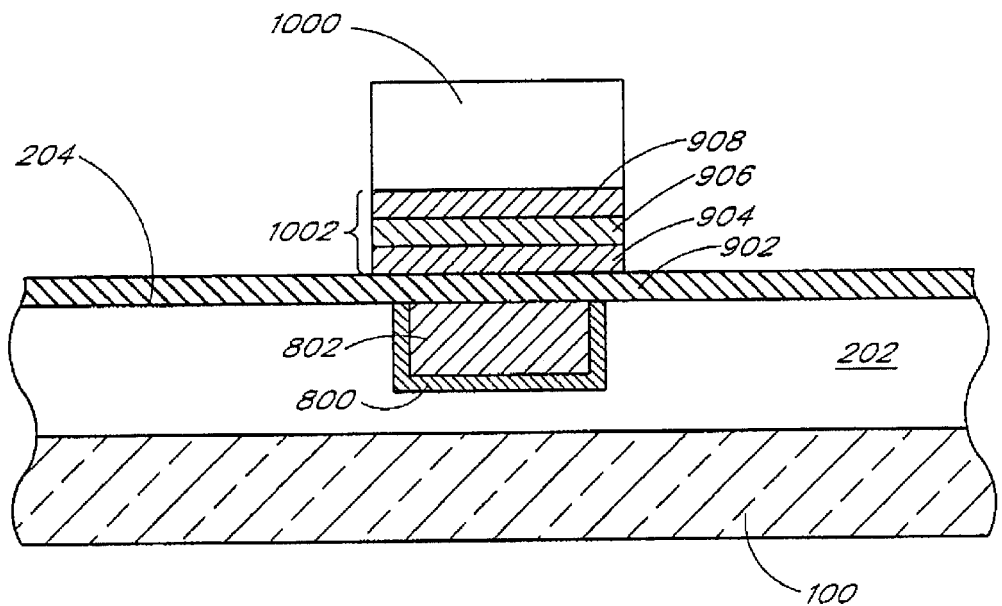
Figure 10D:
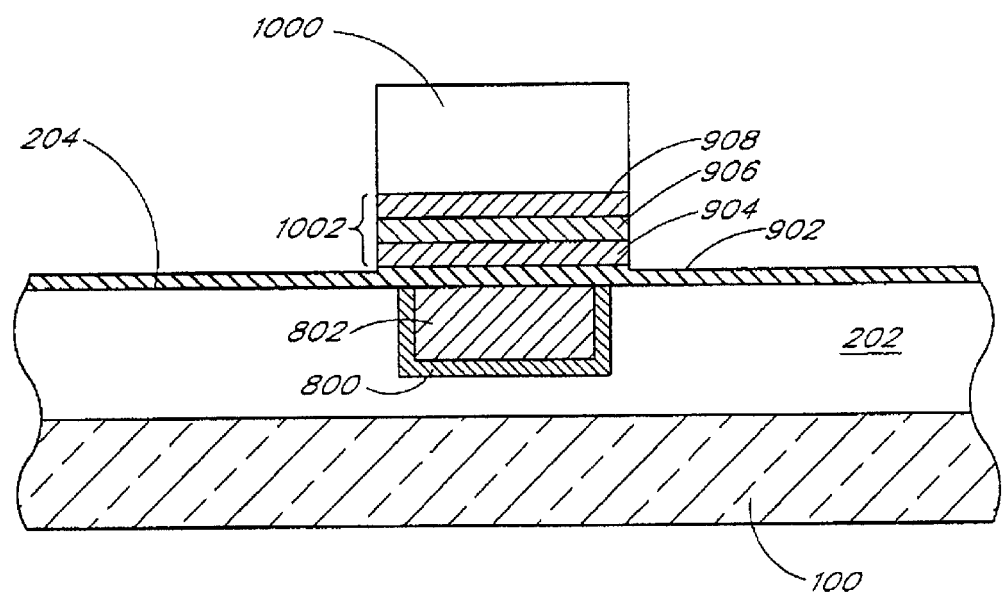
Figure 10E:
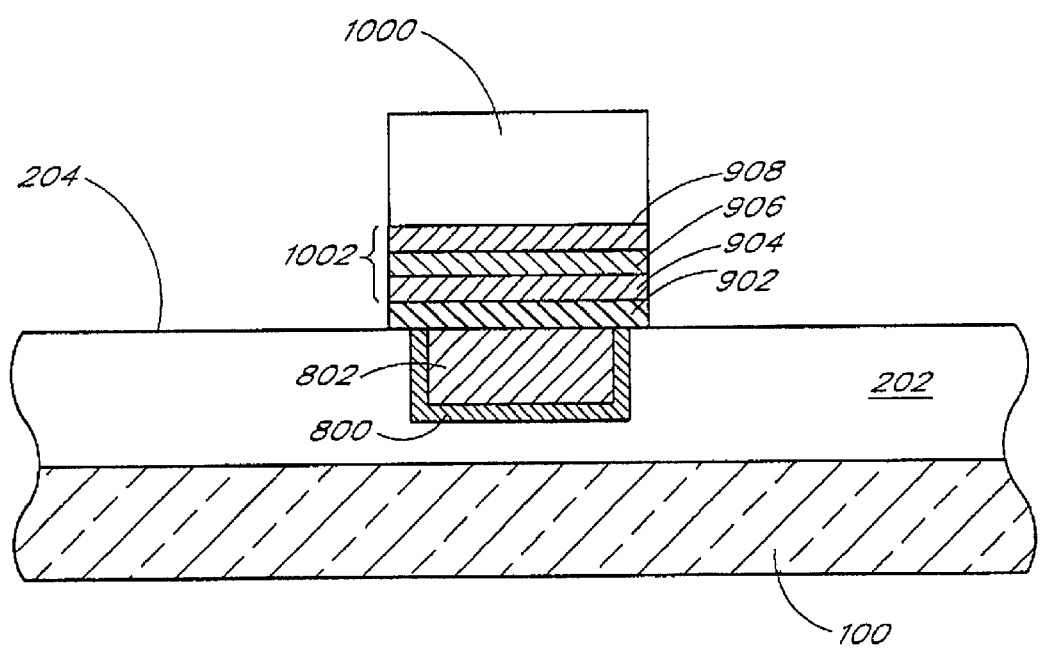

During patterning of the MRAM cells, a portion of the etch stop layer 902 can also be removed. FIG. 10C illustrates an arrangement where relatively little of the etch stop layer 902 has been removed by the etching process. FIG. 10D illustrates an arrangement where a moderate amount of selected portions of the etch stop layer 902 has been removed by the etching process. FIG. 10E illustrates an arrangement where the etch stop layer 902 is nearly completely removed from the upper surface 204 of the insulating material 202. In one arrangement, the process patterns the MRAM stack and removes some of the etch stop layer 902 as shown in FIGS. 10C and 10D. The process then uses a second etchant to remove remaining portions of the etch stop layer 902. The second etchant is preferable relatively benign to the lower electrode and to the material of the insulating layer. In addition, the same or a different photoresist structure can be used to etch with the second etchant. The photoresist structure 1000 is removed after the desired amount of the etch stop layer 902 is removed for further processing of the substrate assembly as shown in FIGS. 10C, 10D, and 10E. The further processing can include, for example, fabrication of an upper electrode by damascene processing techniques.

Figure 11A:
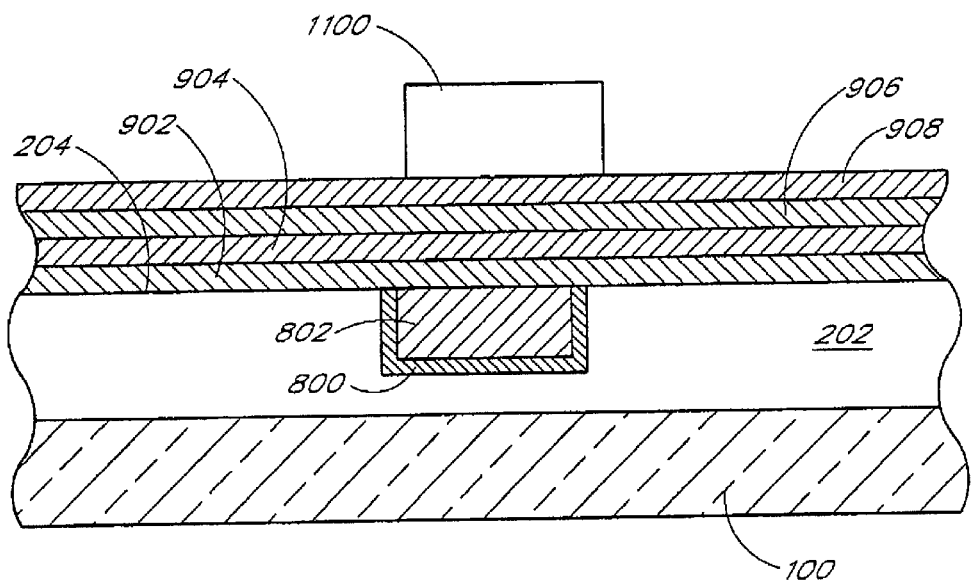
FIGS. 11A–E are partial cross-sectional views that schematically illustrate an intermediate step in the formation of a magnetoresistive memory element, where a resist pattern is relatively poorly aligned with a lower electrode

FIG. 11A illustrates a photoresist structure 1100 formed on the second ferromagnetic layer 908, where the photoresist structure 1100 is relatively poorly aligned with the lower electrode 802. The photoresist structure 1100 can be formed by a photolithography process as described earlier in connection with FIG. 10A.

Figure 11B:
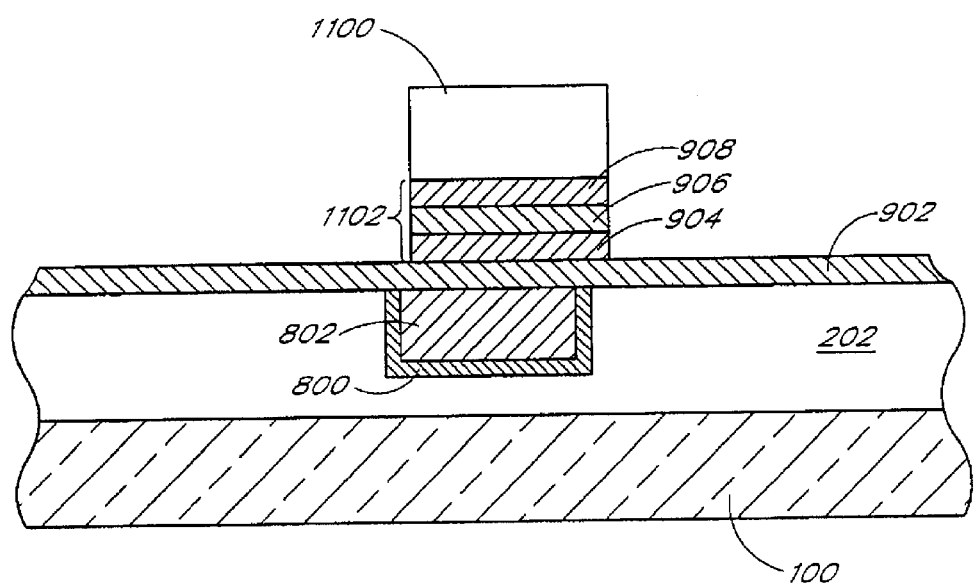

As shown in FIG. 11B, an etching process can remove the portions of the substrate assembly that are left exposed through openings in the photoresist. This patterns the MRAM cells as described earlier in connection with FIG. 10B. The etch stop layer 902 protects the underlying lower electrode 802 from the etchant that is used to pattern the MRAM cells. Advantageously, the etch stop layer 902 protects the lower electrode 802 from the etchant even when the photoresist structure 1100 is relatively poorly aligned with the lower electrode 802.

Figure 11C:
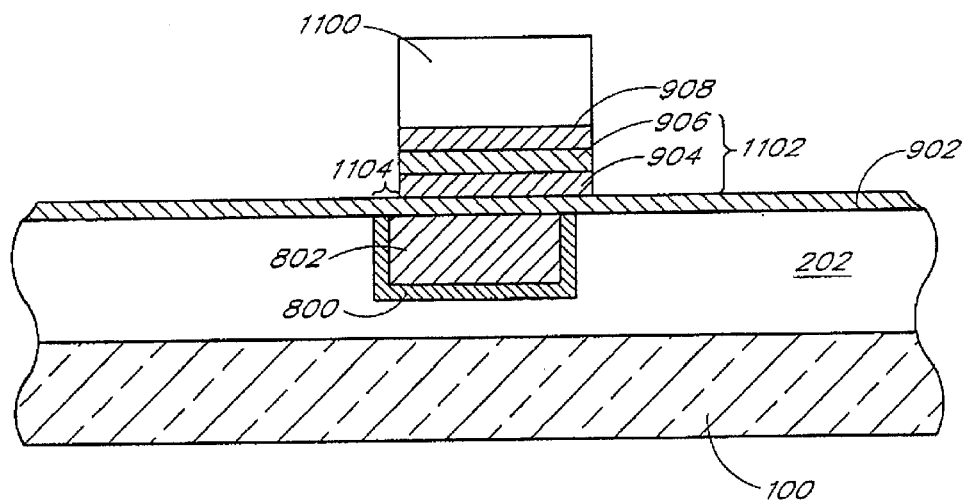
Figure 11D:
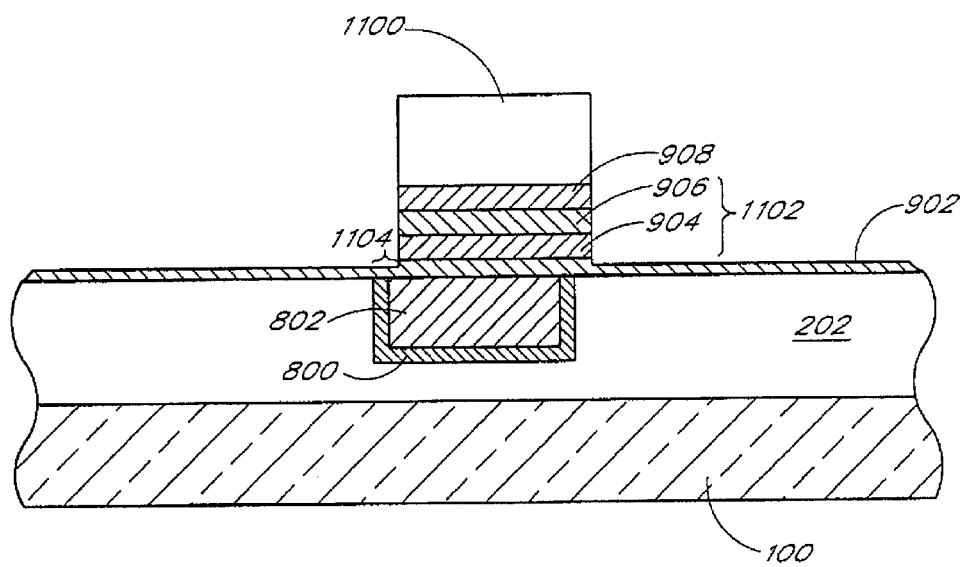
Figure 11E:
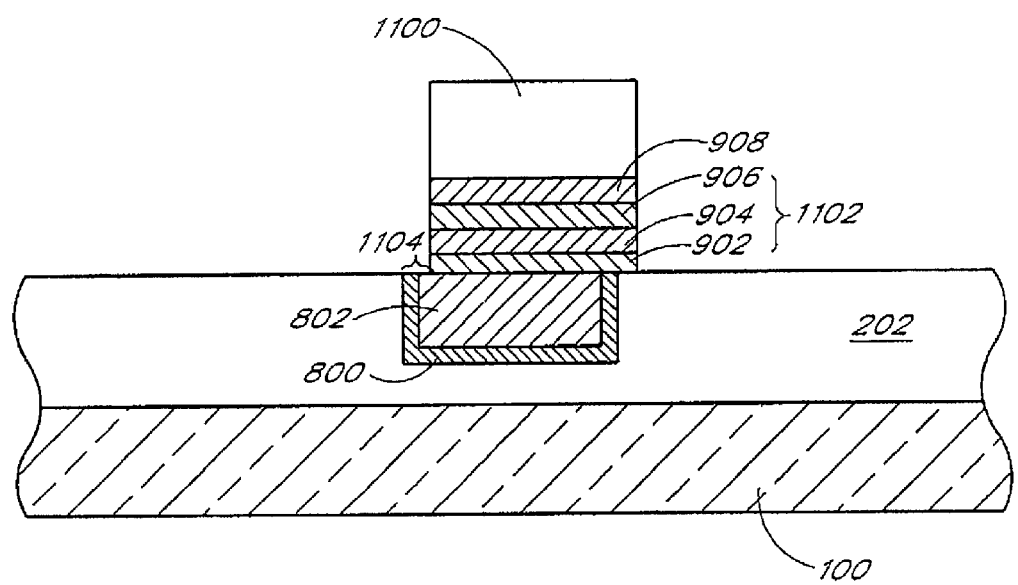

FIG. 11C illustrates an arrangement where relatively little of the etch stop layer 902 has been removed from the substrate assembly. A setoff area 1104 is a result of the relatively poor alignment between the photoresist structure 1100 and the lower conductor 802. Misalignment of the photoresist structure 1100 and the lower conductor 802 can occur as a result of normal process variability. It will be understood that the sensitivity to variability can increase as device geometries shrink. The etch stop layer 902 advantageously protects the portions of the lower conductor 802 corresponding to the setoff area 1004 from the unintended exposure to the etchant during the etching of the MRAM stack 1102. FIG. 11D illustrates an arrangement where a moderate amount of selected portions of the etch stop layer 902 has been removed by the etching process. FIG. 11E illustrates an arrangement where the etch stop layer 902 is nearly completely removed from the upper surface 204 of the insulating material 202.

FIG. 12 is a partial perspective view of a portion of a memory array with individual etch stop layers underneath memory elements. The illustrated portion of the memory array includes an insulating layer 1200, which can be formed over a semiconductor substrate (not shown). The memory array can couple to components in the semiconductor substrate with plugs and the like (not shown). The insulating layer 1200 has a relatively flat upper surface 1202, upon which the etch stop layer and MRAM stacks are formed. The illustrated portion of the memory array includes a first lower electrode 1204 and a second lower electrode 1206, which have been formed in trenches cut into the insulating layer 1200. A first liner 1208 and a second liner 1210 protect against the undesired diffusion of atoms to and from the first lower electrode 1204 and the second lower electrode 1206, respectively, and the insulating layer 1200. It will be understood that the liners can correspond to simple barrier layers or to more complex multiple layer lines as described earlier in connection with FIGS. 4, 5, and 6. The first liner 1208 and the second liner 1210 can also provide adhesion between the electrodes and the insulating layer 1200 and can also include a ferromagnetic component to serve as a magnetic keeper.

The first lower electrode 1204 is coupled to a first MRAM stack 1212 through a first etch stop layer piece 1214. A second MRAM stack 1216 is also coupled to the first lower electrode 1204 through a second etch stop layer piece 1218. In the embodiment illustrated in FIG. 12, the first etch stop layer piece 1214 and the second etch stop layer piece 1218 each form islands underneath the respective MRAM stacks.

The second lower electrode 1206 is coupled to a third MRAM stack 1220 and a fourth MRAM stack 1224, through a third etch stop layer piece 1222 and a fourth etch stop layer piece 1226, respectively. It will be understood that the first etch stop layer piece 1214, the second etch stop layer piece 1218, the third etch stop layer piece 1222, and the fourth etch stop layer piece 1226 can be patterned from a single etch stop layer. In one embodiment of the memory array, the etch stop layer is formed from a relatively resistive material, such as titanium aluminum nitride (TiAlN). In the illustrated embodiment of the memory array, relatively little or none of the etch stop layer originally deposited on the upper surface 1202 of the insulating layer 1200 remains on the substrate other than the portions of the etch stop layer below MRAM stacks. Advantageously, patterning of the etch stop layer can be performed with the same mask and photoresist used to pattern the MRAM stacks. For clarity, upper electrodes are not shown in FIGS. 12 and 13. The upper electrodes are coupled to the ends of the MRAM stacks opposite to the etch stop layer. The upper electrodes can be formed by, for example, damascene processing techniques. In one embodiment, the upper electrodes run generally perpendicular to the lower electrodes in a cross-point cell configuration.

Figure 13:
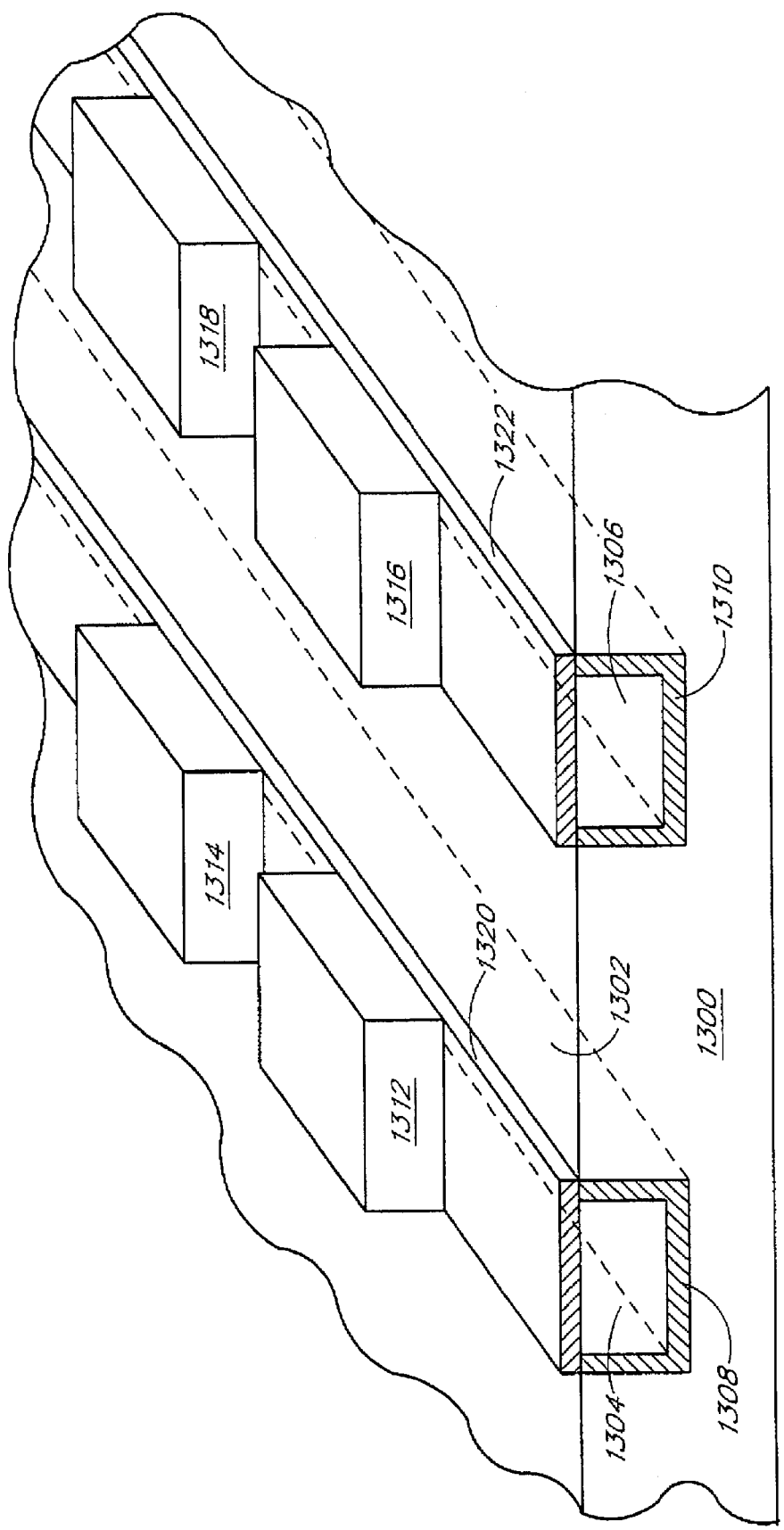
FIG. 13 is a partial perspective view of a portion of a memory array with an etch stop layer underneath a plurality of memory elements.

FIG. 13 is a partial perspective view of a portion of a memory array with an etch stop layer underneath a plurality of memory elements. The illustrated portion of the memory array includes an insulating layer 1300, which can be formed over a semiconductor substrate (not shown). The memory array can couple to components in the semiconductor substrate with plugs and the like (also not shown). The insulating layer 1300 has a relatively flat upper surface 1302, upon which the etch stop layer and MRAM stacks are formed. The illustrated portion of the memory array includes a first lower electrode 1304 and a second lower electrode 1306, which have been formed in trenches cut into the insulating layer 1300. A first liner 1308 and a second liner 1310 protect against the undesired diffusion of atoms to and from the first lower electrode 1304 and the second lower electrode 1306, respectively, and the insulating layer 1300. It will be understood that the liners can correspond to simple barrier layers or to more complex multiple layer lines as described earlier in connection with FIGS. 4, 5, and 6. The first liner 1308 and the second liner 1310 can also provide adhesion between the first lower electrode 1304 and the second lower electrode 1306, respectively, to the insulating layer 1300. The first liner 1308 and the second liner 1310 can also include a ferromagnetic component to serve as a magnetic keeper.

The illustrated portion of the memory array includes a first MRAM stack 1312, a second MRAM stack 1314, a third MRAM stack 1316, and a fourth MRAM stack 1318. The first MRAM stack 1312 and the second MRAM stack 1314 are coupled to the first lower electrode 1304 through a first etch stop layer piece 1320, which runs the entire length of the first lower electrode 1305 in the illustrated embodiment. The first etch stop layer piece 1320 can run shorter lengths as well, such as a length of at least two cells on the first lower electrode 1305. A second etch stop layer piece 1322 is formed between the second lower electrode 1306 and the third MRAM stack 1316 and the fourth MRAM stack 1318.

It will be understood that the first etch stop layer piece 1320 and the second etch stop layer piece 1322 can be patterned from the same etch stop layer. Patterning of the etch stop layer can occur before or after patterning of the MRAM stacks. The first etch stop layer piece 1320 and the second etch stop layer piece 1322 are preferably formed to cover at least the otherwise exposed upper surfaces of the first lower electrode 1304 and the second lower electrode 1306. However, there is preferably little or none of the etch stop layer between the first etch stop layer piece 1320 and the second etch stop layer piece 1322 such that there is relatively little conductivity between the first lower electrode 1304 and the second lower electrode 1306 through the etch stop layer.

FIGS. 14A–D are partial perspective views that schematically illustrate steps in the formation of a memory array, where the magnetoresistive memory elements are patterned after patterning of the etch stop layer.

The illustrated portion of the memory array includes an insulating layer 1400, which can be formed over a semiconductor substrate 1402. The memory array can couple to components (not shown) in the semiconductor substrate 1402 with plugs and the like (not shown). The insulating layer 1400 has a relatively flat upper surface 1404, upon which the etch stop layer and MRAM stacks are formed. The illustrated portion of the memory array includes a first lower electrode 1406 and a second lower electrode 1408, which have been formed in trenches cut into the insulating layer 1400. A first liner 1410 and a second liner 1412 protect against the undesired diffusion of atoms to and from the first lower electrode 1406 and the second lower electrode 1408, respectively, and the insulating layer 1400. It will be understood that the liners can correspond to simple barrier layers or to more complex multiple layer lines as described earlier in connection with FIGS. 4, 5, and 6.

An etch stop layer 1414 is formed above the insulating layer 1400 as described earlier in connection with FIG. 9. The magnetoresistive layers that form the MRAM stack or magnetoresistive stack are formed above the etch stop layer 1414. In the illustrated embodiment, a first ferromagnetic layer 1416, a spacer layer 1418, and a second ferromagnetic layer 1420 later form the magnetoresistive stack or cell body of MRAM cells. It will be understood that the configuration of the layers in a magnetoresistive stack of an MRAM can vary broadly and that the first ferromagnetic layer 1416, the spacer layer 1418, and the second ferromagnetic layer 1420 are shown only for illustrative purposes. For example, the magnetoresistive layers can further include additional layers of spacer layers and ferromagnetic layers, can further include pinning layers and seed layers, and the like.

A first photoresist mask 1422 and a second photoresist mask 1424 are formed on the second ferromagnetic layer 1420 or the topmost layer of the magnetoresistive stack layers. In the illustrated embodiment, the first photoresist mask 1422 and the second photoresist mask 1424 are relatively centered about the first lower electrode 1406 and the second lower electrode 1408, respectively. Preferably, the photoresist masks run the length of their respective electrodes. The process proceeds to pattern the etch stop layer.

Figure 14A:
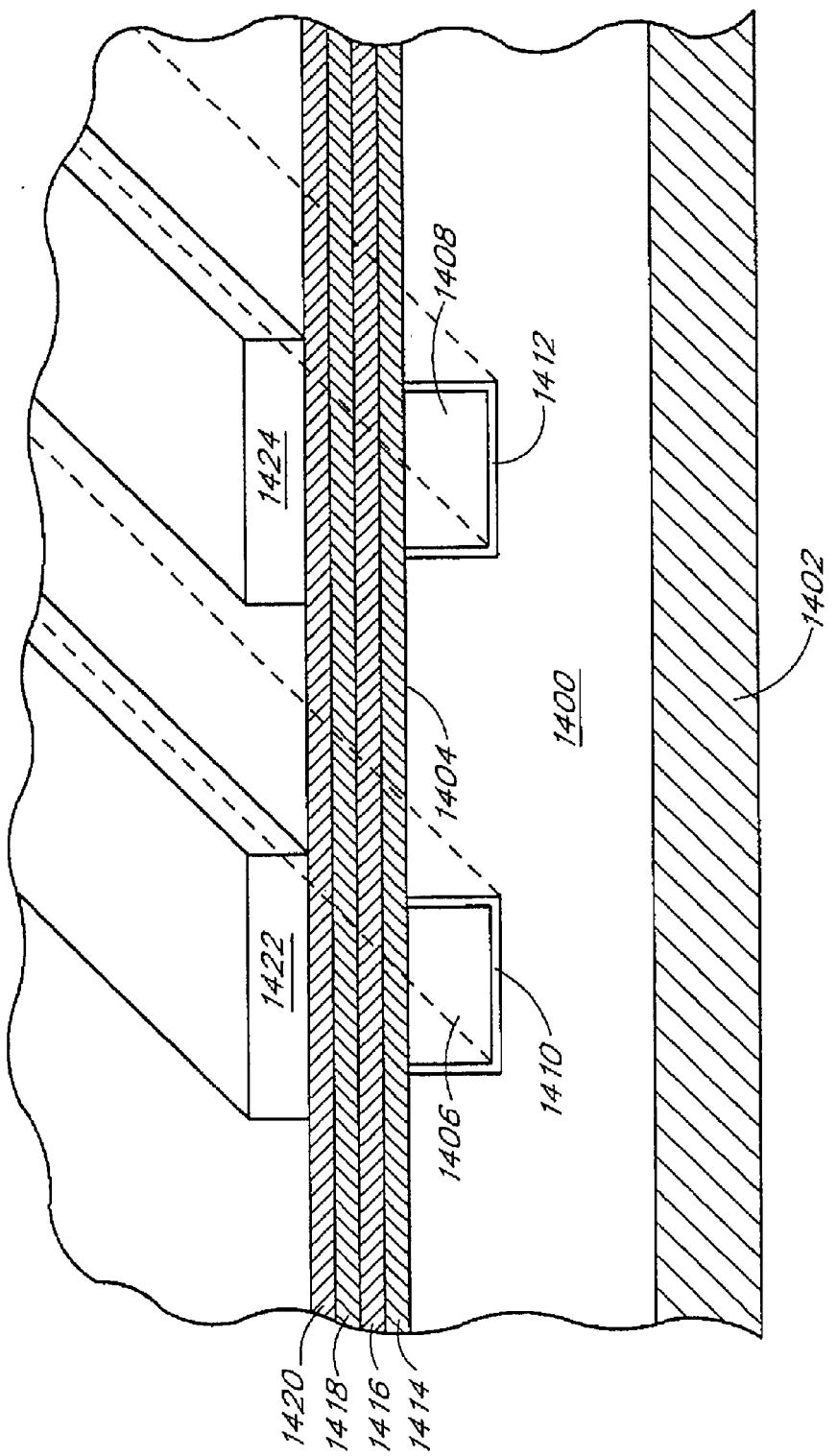
FIGS. 14A–D are partial perspective views that schematically illustrate steps in the formation of a memory array, where the magnetoresistive memory elements are patterned after patterning of the etch stop layer.
Figure 14B:
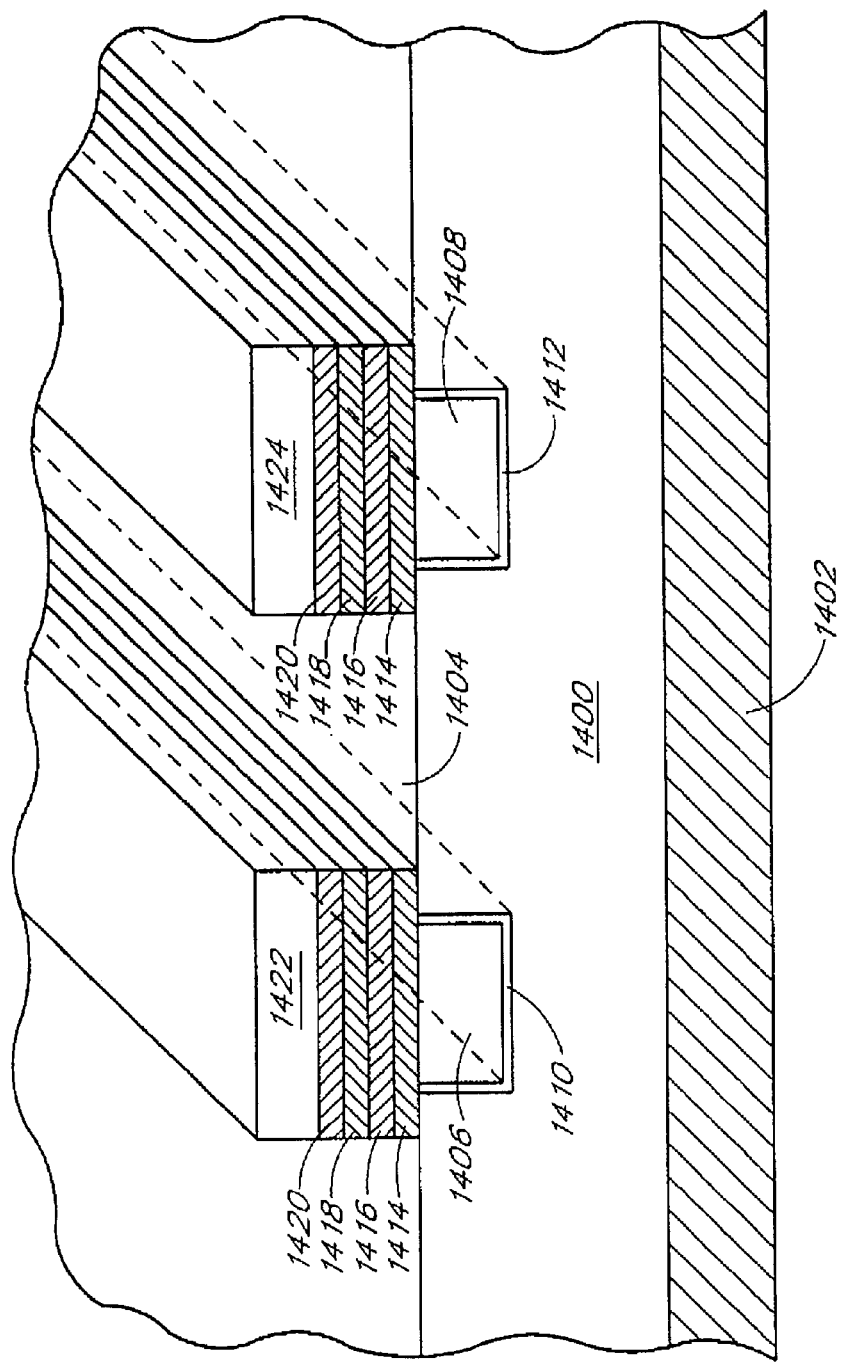

FIG. 14B is a partial perspective view of the portion of the memory array after the etch stop layer is patterned. Preferably, the process uses a directional etching process or anisotropic etch technique to etch selected areas of the etch stop layer 1414 and the layers that form the magnetoresistive stack, e.g., the first ferromagnetic layer 1416, the spacer layer 1418, and the second ferromagnetic layer 1420. As illustrated in FIG. 14B, patterning of the etch stop layer should leave little or none of the etch stop layer in at least portion of the space between adjacent electrodes, such that there is relatively little or no conductivity between adjacent electrodes through the etch stop layer. The first photoresist mask 1422 and the second photoresist mask 1424 are then removed and the process prepares to pattern the MRAM cells.

Figure 14C:
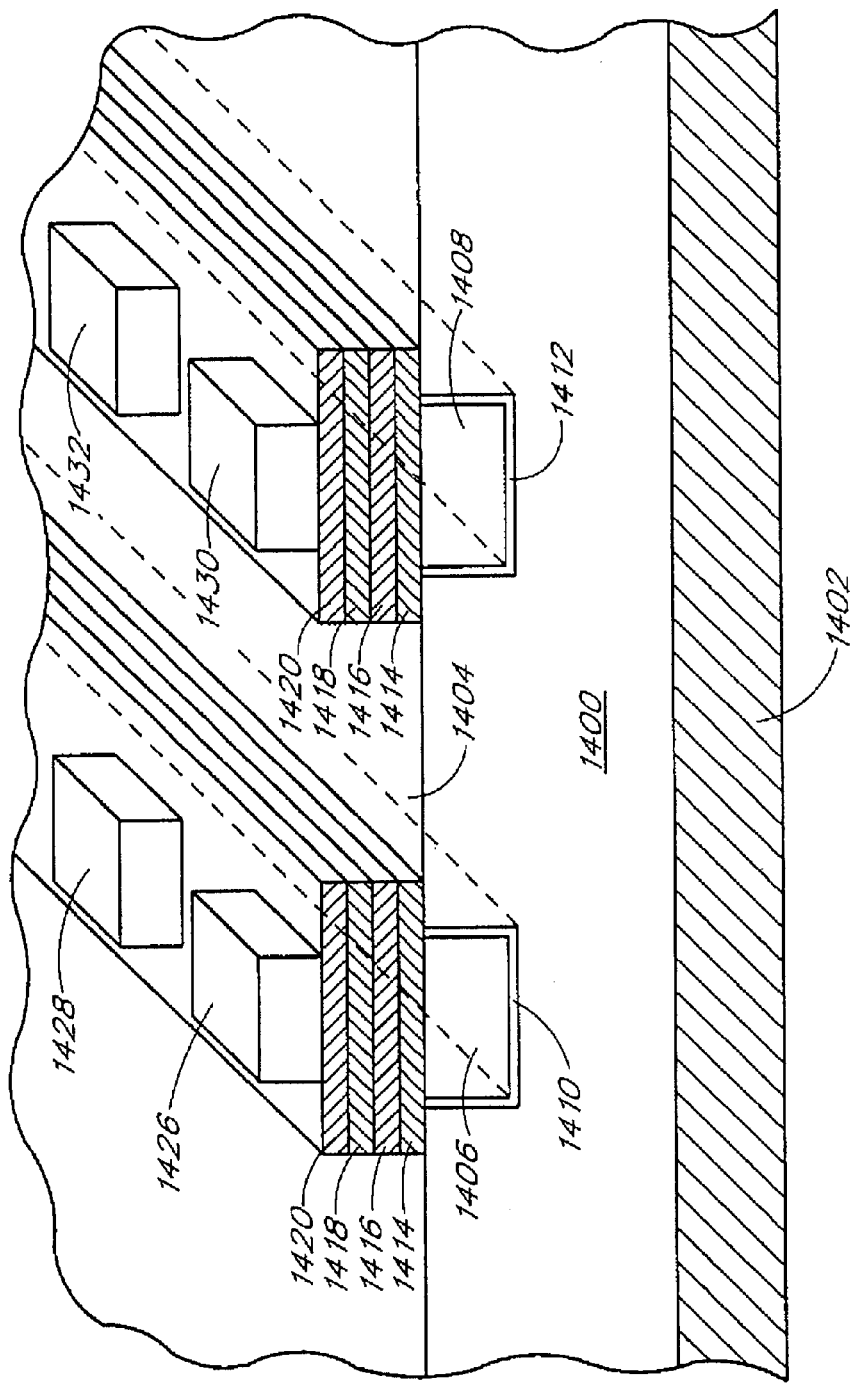

FIG. 14C illustrates a partial perspective view of the portion of the memory array after photoresist masks are applied to pattern the MRAM cells. A third photoresist mask 1426, a fourth photoresist mask 1428, a fifth photoresist mask 1430, and a sixth photoresist mask 1432 are formed on the second ferromagnetic layer 1420 or the topmost layer of the layers that form the magnetoresistive stack. The process then applies an etch, such as an anisotropic etch, to pattern the MRAM cells.

Figure 14D:
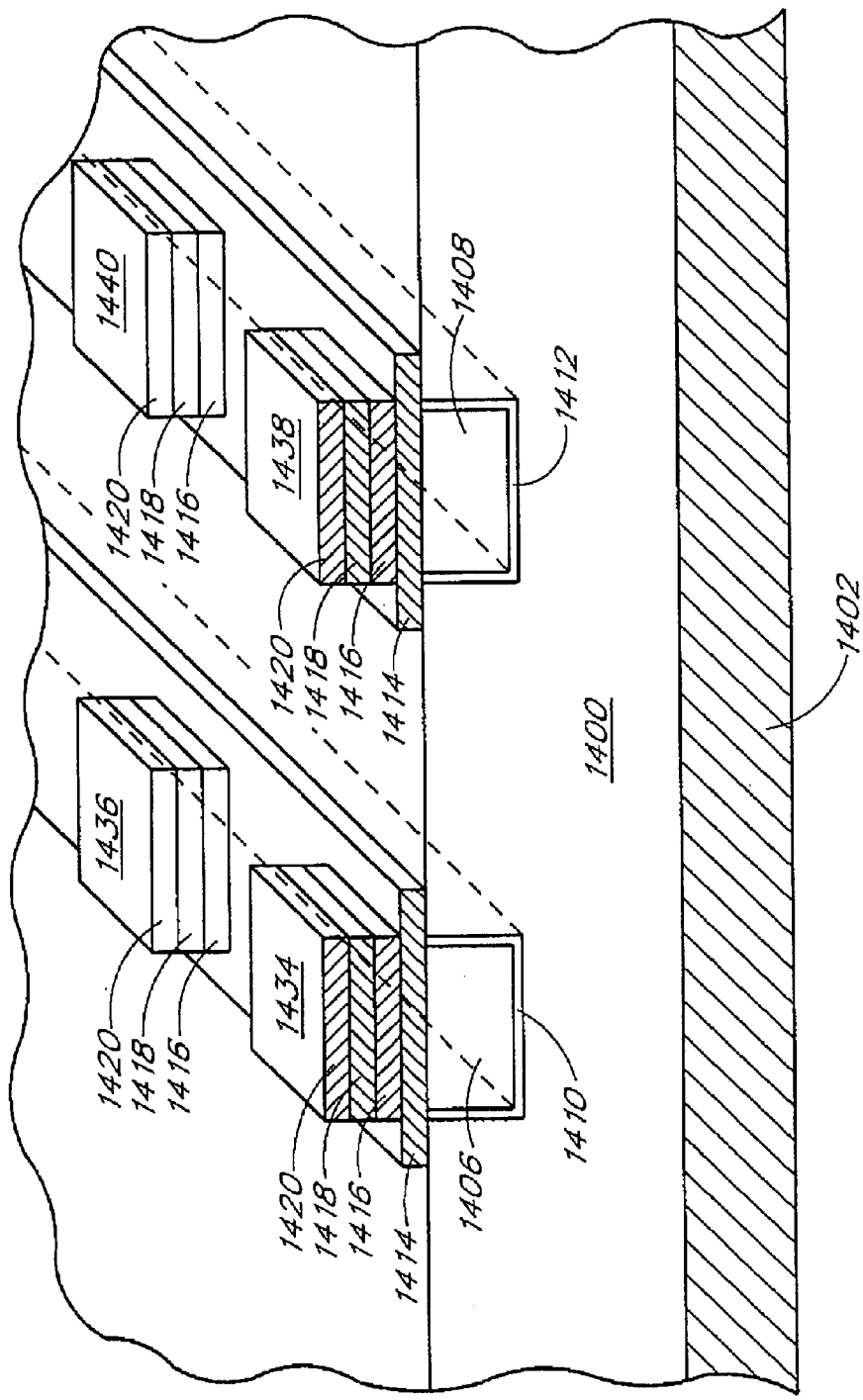

FIG. 14D illustrates a partial perspective view of the portion of the memory array after patterning of the MRAM cells. As illustrated in FIG. 14D, the etching around the third photoresist mask 1426, the fourth photoresist mask 1428, the fifth photoresist mask 1430, and the sixth photoresist mask 1432 of FIG. 14C patterns a first MRAM cell 1434, a second MRAM cell 1436, a third MRAM cell 1438, and a fourth MRAM cell 1440, respectively. Advantageously, the remaining portions of the etch stop layer 1414 can protect the first lower electrode 1406 and the second lower electrode 1408 from damage during patterning of the MRAM cells. In the illustrated embodiment, the remaining portions of the etch stop layer 1414 are larger than the first lower electrode 1406 or the second lower electrode 1408, which can also serve to protect the lower electrodes.

Various embodiments of the invention have been described above. Although this invention has been described with reference to these specific embodiments, the descriptions are intended to be illustrative of the invention and are not intended to be limiting. Various modifications and applications may occur to those skilled in the art without departing from the true spirit and scope of the invention as defined in the appended claims.

I claim:

1. A method of fabricating a portion of a magnetic memory device, the method comprising:

providing a substrate assembly with an insulating material, where the substrate assembly includes an electrode in a trench, where an upper surface of the electrode is substantially flush with an upper surface of the insulating material;

forming an etch stop layer on the upper surface of the substrate assembly, where a material for the etch stop layer is not ferromagnetic;

forming a magnetoresistive stack of layers, where the magnetoresistive stack of layers includes at least a first ferromagnetic layer, a spacer layer, and a second ferromagnetic layer;

forming a mask pattern on top of the magnetoresistive stack of layers;

patterning the magnetoresistive stack of layers and at least a portion of the etch stop layer with a first etchant to define MRAM cells; and patterning with a second etchant after patterning with the first etchant, where patterning with the second etchant removes selected portions of the etch stop layer.

2. The method as defined in claim 1, wherein patterning with the second etchant is performed prior to patterning with the first etchant.

3. The method as defined in claim 1, wherein patterning with the second etchant is performed after patterning with the first etchant.

4. The method as defined in claim 3, wherein patterning with the first etchant comprises an anisotropic etching and patterning with the second etchant comprises selective chemical etching.

5. The method as defined in claim 1, wherein the material of the etch stop layer comprises titanium aluminum nitride (TiAlN).

6. The method as defined in claim 5, wherein the etch stop layer has a thickness in a range between about 100 Angstroms (Å) and 500 Å.

7. The method as defined in claim 1, wherein the material of the etch stop layer comprises at least one of tantalum nitride (TaN), tungsten silicon nitride (WSiN), and tantalum silicon nitride (TaSiN).

8. The method as defined in claim 1, wherein the material of the etch stop layer comprises at least one of tantalum (Ta), aluminum, titanium, and tungsten.

9. The method as defined in claim 1, wherein patterning comprises removing portions of the etch stop layer such that the etch stop layer is discontinuous between the electrode and an adjacent electrode.

10. A method of fabricating a portion of a magnetic memory device, the method comprising:

providing a substrate assembly with a copper electrode in a trench;

forming a layer of titanium aluminum nitride (TiAlN) on the upper surface of the substrate assembly;

forming a magnetoresistive stack of layers, where the magnetoresistive stack of layers includes at least a first ferromagnetic layer, a spacer layer, and a second ferromagnetic layer;

forming a mask pattern on top of the magnetoresistive stack of layers; and patterning the magnetoresistive stack of layers to define MRAM cells.

11. The method as defined in claim 10, further comprising forming the titanium aluminum nitride (TiAlN) layer to a thickness in a range between about 100 Angstroms (Å) and 200 Å.

12. The method as defined in claim 10, wherein patterning the magnetoresistive stack of layers comprises a reactive ion etch (RIE) process.

13. The method as defined in claim 12, further comprising removing the etch stop layer by forming a second mask pattern on top of the magnetoresistive stack of layers and patterning the etch stop layer with the second mask pattern.

14. The method as defined in claim 13, further comprising removing the etch stop layer before patterning of the magnetoresistive stack of layers that defines MRAM cells.

15. A method of fabricating a portion of a magnetic memory device, the method comprising:

providing an electrode in a trench of an insulating layer, where an upper surface of the electrode is substantially flush with the upper surface of the substrate assembly;

forming an etch stop layer on at least the upper surface of the electrode, where a material for the etch stop layer is not ferromagnetic;

forming a magnetoresistive stack of layers, where the magnetoresistive stack of layers includes at least a first ferromagnetic layer, a spacer layer, and a second ferromagnetic layer;

forming a mask pattern on top of the magnetoresistive stack of layers;

patterning with a first etchant, where the first etchant is selected to remove portions of the magnetoresistive stack of layers that are not protected by the mask pattern, where patterning with the first etchant defines MRAM cells; and patterning with a second etchant to remove at least a portion of the etch stop layer.

16. The method as defined in claim 15, wherein the electrode comprises copper, the etch stop layer comprises titanium aluminum nitride (TiAlN), the first etchant comprises a chlorine-based etchant, and the second etchant comprises a fluorine-based etchant.

17. The method as defined in claim 15, wherein the first etchant comprises a directional etchant and the second etchant comprises a non-directional selective etch.

18. The method as defined in claim 15, wherein patterning with the first etchant removes at least a portion of the etch stop layer and patterning with the second etchant removes remaining portions of the etch stop layer from select areas of the substrate assembly.

19. The method as defined in claim 15, wherein the same mask pattern is used while patterning with the first etchant and patterning with the second etchant.

20. The method as defined in claim 15, further comprising:

removing the mask pattern after patterning with the first etchant;

forming a second mask pattern on top of the substrate assembly, where the second mask pattern covers portions of the magnetoresistive stack of layers and portions of the etch stop layer; and using the second mask pattern when patterning with the second etchant.

21. The method as defined in claim 15, the insulating material comprises silicon oxide ($SiO_2$), the electrode comprises copper (Cu), and where the second etchant is substantially non-corrosive at least to silicon dioxide ($SiO_2$) and to copper (Cu).

22. The method as defined in claim 15, wherein the second etchant removes material from the etch stop layer at a first rate and material from the electrode at a second rate, and where the second rate is slower than the first rate.

23. A method of fabricating an in-situ resistor in a magnetoresistive random access memory, the method comprising:

forming a layer of a resistive material on a substrate assembly;

forming a magnetoresistive stack on the layer of the resistive material; and forming a layer of mask material on the magnetoresistive stack, where the layer of mask material defines openings to expose select portions of the magnetoresistive stack; and etching through the openings of the mask material to define magnetic cells.

24. The method as defined in claim 23, wherein the resistive material comprises titanium aluminum nitride (TiAlN).

25. The method as defined in claim 23, wherein a thickness of the resistive material ranges from about 100 Angstroms (Å) to about 500 Å.

26. A method of providing partial isolation of a first magnetic memory cell in a memory array such that a failed memory cell can be isolated, the method comprising:

providing a first electrode that is coupled to a first group of magnetic memory cells, where the first magnetic memory cell is a member of the first group of magnetic memory cells;

providing a second electrode that is coupled to a second group of magnetic memory cells, where the first magnetic memory cell is also a member of the first group of magnetic memory cells; and coupling the first magnetic memory cell to the first electrode and to the second electrode through an in situ resistor with a predetermined resistance of at least 100 ohms, where the in situ resistor is in series with the first magnetic memory cell, but not in series with other magnetic memory cells.

27. The method as defined in claim 26, wherein the in situ resistor is formed between the first electrode and the first magnetic memory cell by a layer of resistive material.

28. The method as defined in claim 27, where the resistive material comprises titanium aluminum nitride (TiAlN).

29. The method as defined in claim 27, where the resistive material comprises at least one of tantalum nitride (TaN), tungsten silicon nitride (WSiN), and tantalum silicon nitride (TaSiN).

30. The method as defined in claim 27, where the layer of resistive material extends the length of the first electrode.

31. An in situ resistor in a magnetoresistive memory cell comprising:

a first side coupled to an electrode in a damascene trench;

a second side coupled to a magnetoresistive cell; and resistive material between the first side and the second side, and where the resistive material has a resistivity of at least 0.2 ohm-centimeters ($\Omega$-cm).

32. The in situ resistor as defined in claim 31, where the resistive material is titanium aluminum nitride (TiAlN).

33. The in situ resistor as defined in claim 31, where the resistive material comprises at least one of tantalum nitride (TaN), tungsten silicon nitride (WSiN), and tantalum silicon nitride (TaSiN).

34. The in situ resistor as defined in claim 31, where the resistive material comprises at least one of metal nitride, metal nitro-silicide, and metal alloy nitride.

35. The in situ resistor as defined in claim 31, where the resistive material is between about 100 angstroms (Å) and about 500 Å in thickness.

36. A magnetoresistive memory cell comprising:

a lower electrode with an upper surface;

a magnetoresistive stack with a first end and a second end, where the magnetoresistive stack is oriented such that the first end of the magnetoresistive stack faces in the direction of the lower electrode, and where a cell body of the magnetoresistive stack corresponds to a first pattern;

an upper electrode coupled to the second end of the magnetoresistive stack; and a resistive etch stop layer disposed at least between the upper surface of the lower electrode and the first end of the magnetoresistive stack.

37. The magnetoresistive memory cell as defined in claim 36, wherein the etch stop layer comprises titanium aluminum nitride (TiAlN).

38. The magnetoresistive memory cell as defined in claim 36, wherein the etch stop layer comprises at least one of tantalum nitride (TaN), tungsten silicon nitride (WSiN), and tantalum silicon nitride (TaSiN).

39. The magnetoresistive memory cell as defined in claim 36, wherein the etch stop layer comprises at least one of metal nitride, metal nitro-silicide, and metal alloy nitride.

40. The memory cell as defined in claim 36, where the lower electrode comprises copper, where the lower electrode is disposed within a trench of a dielectric material, and where an upper surface of the lower electrode is substantially coplanar with an upper surface of the dielectric material.

41. A magnetoresistive memory cell comprising:

a lower electrode with an upper surface, where the lower electrode is disposed within a trench of a dielectric material, where the upper surface of the lower electrode is substantially coplanar with an upper surface of the dielectric material;

a magnetoresistive stack with a first end and a second end, where the first end of the magnetoresistive stack faces in the direction of the lower electrode;

an upper electrode coupled to the second end of the magnetoresistive stack; and an etch stop layer disposed at least between the upper surface of the lower electrode and the first end of the magnetoresistive stack, where an area of the etch stop layer is larger than the lower electrode such that a portion of the etch stop layer overlays the lower electrode and a portion of the upper surface of the dielectric material.

42. The magnetoresistive memory cell as defined in claim 41, where the etch stop layer comprises titanium aluminum nitride (TiAlN).

43. The magnetoresistive memory cell as defined in claim 41, where the etch stop layer comprises at least one of tantalum (Ta), aluminum, titanium, tungsten, tantalum nitride (TaN), tungsten silicon nitride (WSiN), and tantalum silicon nitride (TaSiN).

44. The magnetoresistive memory cell as defined in claim 41, wherein the etch stop layer comprises at least one of metal nitride, metal nitro-silicide, and metal alloy nitride.

45. The magnetoresistive memory cell as defined in claim 41, wherein the etch stop layer is further disposed between the upper surface of the lower electrode and a second magnetoresistive stack corresponding to an adjacent magnetoresistive memory cell.

46. A magnetoresistive random access memory (MRAM) device comprising:

a plurality of lower electrodes, each having an upper surface, where the lower electrodes are disposed within a plurality of trenches of a dielectric material, where the upper surfaces of the lower electrodes are substantially coplanar with an upper surface of the dielectric material;

a plurality of magnetoresistive cells each having a first end and a second end, where the first ends of magnetoresistive cells face in the direction of corresponding lower electrodes, and where cell bodies of the magnetoresistive cells correspond to a first pattern;

a plurality of upper electrodes coupled to the second ends of the magnetoresistive cells; and a resistive etch stop layer with a plurality of isolated pieces, where the isolated pieces are disposed between the upper surfaces of the lower electrodes and the first ends of magnetoresistive cells, where at least one of the isolated pieces is disposed under at least one of the magnetoresistive cells.

47. The MRAM as defined in claim 46, wherein at least one of the isolated pieces is disposed under at least two adjacent magnetoresistive cells of a common lower electrode.

48. The MRAM as defined in claim 46, wherein each isolated piece is patterned with the first pattern such that there is one isolated piece for each magnetoresistive cell.

49. The MRAM as defined in claim 46, wherein the resistive etch stop layer comprises titanium aluminum nitride (TiAlN).

50. The MRAM as defined in claim 46, wherein the resistive etch stop layer comprises at least one of tantalum nitride (TaN), tungsten silicon nitride (WSiN), and tantalum silicon nitride (TaSiN).

51. The MRAM as defined in claim 46, wherein the resistive etch stop layer comprises at least one of metal nitride, metal nitro-silicide, and metal alloy nitride.

52. The MRAM as defined in claim 46, wherein portions of the resistive etch stop layer have been removed from at least parts of regions between adjacent lower electrodes such that there is substantially no electrical conductivity between adjacent lower electrodes through the resistive etch stop layer.

53. The MRAM as defined in claim 46, wherein the lower electrodes and the upper electrodes are arranged in a cross point configuration.

* * * * *